United States Patent
Huang

(10) Patent No.: US 12,523,936 B2
(45) Date of Patent: Jan. 13, 2026

(54) METHOD OF MANUFACTURING SEMICONDUCTOR DEVICE

(71) Applicant: NANYA TECHNOLOGY CORPORATION, New Taipei (TW)

(72) Inventor: Yu-Chen Huang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 860 days.

(21) Appl. No.: 17/810,349

(22) Filed: Jul. 1, 2022

(65) Prior Publication Data
US 2024/0004302 A1    Jan. 4, 2024

(51) Int. Cl.
*G03F 7/38* (2006.01)
*G03F 7/039* (2006.01)
*H01L 21/027* (2006.01)

(52) U.S. Cl.
CPC ............... *G03F 7/38* (2013.01); *G03F 7/039* (2013.01); *H01L 21/0274* (2013.01)

(58) Field of Classification Search
CPC ......... G03F 7/38; G03F 7/039; H01L 21/0274
See application file for complete search history.

(56) References Cited

U.S. PATENT DOCUMENTS

| | | | | |
|---|---|---|---|---|
| 6,218,082 | B1* | 4/2001 | Yang | G03F 7/38 430/330 |
| 6,456,358 | B1* | 9/2002 | Lu | H10K 59/173 430/326 |
| 2010/0068657 | A1* | 3/2010 | Yang | H01L 21/0273 430/323 |
| 2012/0315449 | A1* | 12/2012 | Tsubaki | G03F 7/038 430/311 |
| 2014/0363955 | A1 | 12/2014 | Hatakeyama et al. | |
| 2020/0090927 | A1* | 3/2020 | Yaegashi | G03F 7/38 |

OTHER PUBLICATIONS

C.K.Chen, et al., PEB to development delay influence on contact patterning by negative tone development process, Proc. SPIE vol. 8682, Advances in Resist Materials and proceeding Technology, Mar. 29, 2013, San Jose, California, United States, doi:10.1117/12.2010755.

* cited by examiner

*Primary Examiner* — Jonathan Johnson
*Assistant Examiner* — Alexander N. Lee
(74) *Attorney, Agent, or Firm* — CKC & Partners Co., LLC

(57) ABSTRACT

A method of manufacturing a semiconductor device includes forming a photoresist layer over a substrate. A portion of the photoresist layer is exposed, using a mask, to a radiation. The photoresist layer is treated, using a basic gas. The photoresist layer is developed to form a patterned photoresist layer over the substrate.

18 Claims, 3 Drawing Sheets

METHOD OF MANUFACTURING SEMICONDUCTOR DEVICE

BACKGROUND

Technical Field

The disclosure relates to a method of manufacturing a semiconductor device, and more particularly, to a method of photolithography process in manufacturing a semiconductor device.

Description of Related Art

Since various electronic devices, such as personal computers, computer tablets, cell phones, and other electronic equipment, has become smaller and smaller, size of individual components of these electronic devices have to be decreased as well. The components are also semiconductor devices, which are typically fabricated by sequentially depositing layers of dielectric materials, conductive materials and/or semiconductor materials over a semiconductor substrate, and then patterning the layers by photolithography techniques, to form a variety of circuit components.

Photolithography is one of the common methods used in fabricating integrated circuit (IC). Photolithography is a process to transfer geometric patterns to a substrate or a layer on the substrate. Basic processes of photolithography include photoresist coating, exposure and development. The exposure step involves exposing a specific region of the photoresist layer to radiation, and the development step involves applying a developer to the photoresist thereby obtaining a desired pattern.

SUMMARY

According to some embodiments of the present disclosure, a method of manufacturing a semiconductor device includes forming a photoresist layer over a substrate. A portion of the photoresist layer is exposed, using a mask, to a radiation. The photoresist layer is treated, using a basic gas. The photoresist layer is developed to form a patterned photoresist layer over the substrate.

According to some embodiments of the present disclosure, a method of manufacturing a semiconductor device includes coating a photoresist layer over a substrate. The photoresist layer is exposed, using a mask, to a radiation. A post exposure baking is performed to the photoresist layer over the substrate. A first gas is removed from a chamber. After removing the first gas from the chamber, a top surface of the photoresist layer is modified in the chamber by using a second gas. A developer is applied to the photoresist layer.

According to some embodiments of the present disclosure, a method of manufacturing a semiconductor device includes forming a photoresist layer over a substrate, in which the photoresist layer includes a photoacid generator. A first region of the photoresist layer is exposed to a radiation to produce photoacid in the photoresist layer. A post exposure baking is performed to the photoresist layer over the substrate. A basic gas is caused flowing over the photoresist layer to react with the photoacid in the photoresist layer. A developer is applied to the photoresist layer to remove a second region of the photoresist layer, in which the second region is not exposed to the radiation.

BRIEF DESCRIPTION OF THE DRAWINGS

Aspects of the present disclosure can be more fully understood by reading the following detailed description of the embodiment, with reference made to the accompanying drawings as follows.

DETAILED DESCRIPTION

Figure 1:
FIG. 1 illustrates a diagram of intermediate stages in a method of manufacturing a semiconductor device according to some embodiments of the invention.

The following disclosure provides many different embodiments, or examples, for implementing different features of the provided subject matter.

Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly.

Generally, in a photolithography process, a photoresist layer is first formed over a substrate. Then, the photoresist layer is exposed through a photomask to a source of radiation. The radiation exposure of the photoresist causes a chemical reaction in an exposed portion of the photoresist layer. Thereafter, the photoresist layer is developed using a developer to form a desired pattern in the photoresist layer.

There are two types of photoresist: positive tone resist (or positive photoresist) and negative tone resist (or negative photoresist). A positive tone resist and a negative tone resist will change their chemical structure when exposing to the radiation, hence changing their dissolution in the developer. Generally, after exposing to the radiation, the exposed portion of the positive tone resist breaks chemical bonds and changes its dissolution in the developer. On the other hand, exposure to the negative tone resist initiates a crosslinking reaction, thus causing the exposed portion of the negative tone resist changes its dissolution in the developer.

Whether a resist is a positive tone or negative tone, the obtained pattern depends on the type of the developer used to develop the resist. For example, when the developer is an aqueous-based developer, such as a tetramethylammonium hydroxide (TMAH) solution, some positive tone resists, which are initially insoluble in the developer solution, provide a positive pattern (i.e. the exposed portions are removed by the developer), and it refers to a positive tone development. On the other hand, the same photoresist provides a negative pattern (i.e. the unexposed portions are removed by the developer) when the developer is an organic solvent, which refers to a negative tone development. Further, the unexposed portions of the negative tone resists are removed by the TMAH, while the exposed portions of the photoresist undergo cross-linking reaction upon exposure to the radiation and remain on the substrate after development. Besides, the exposed portions of the negative tone development may be removed by using the organic solvent as the developer, while the unexposed portions remain on the substrate.

Typically, the photoresist layer includes a photoacid generator (PAG), which absorbs the exposure energy and generates photoacid. The photoacid may serve as a chemical amplification element that switches the solubility of the photoresist. However, the photoacid mainly generated in the exposed portion of the photoresist layer may also diffuse to the unexposed portion, especially in an upper surface with greater amount of the photoacid. Thus, after development, the patterned photoresist layer often shows T-topping pattern profile, which means the patterned photoresist layer remained on the substrate tapers from the upper surface to a bottom surface. In other words, a width of the upper surface of the patterned photoresist layer is often greater than a width of the bottom surface, and sidewalls of the patterned photoresist layer is oblique. Consequently, the pattern shows larger critical dimension (CD) and undesirable critical dimension uniformity.

According to some embodiments of the present invention, a method of manufacturing a semiconductor device is provided to treat the photoresist with a basic gas after exposure. The basic gas may react with the photoacid, especially those diffusing to the unexposed portion of the photoresist, thereby decreasing T-topping pattern profile of the photoresist and improving critical dimension uniformity.

FIGS. 1-4B illustrate diagrams of intermediate stages in a method of manufacturing a semiconductor device according to some embodiments of the invention. As shown in FIG. 1, a photoresist layer 120 is formed over a substrate 110. The substrate 110 may be a semiconductor substrate, such as silicon, germanium, silicon germanium, combination thereof, or the like. The substrate may be a wafer, such as silicon wafer. In some embodiments, the substrate 110 may include a variety of layers on the semiconductor substrate. In some embodiments, the photoresist layer 120 is a photosensitive layer, which can change chemical properties once irradiated by actinic radiation. In some embodiments, the photoresist layer 120 is a positive photoresist. In some embodiments, the photoresist layer 120 includes photoacid generator. In some embodiments, the photoresist layer 120 is formed by using a process such as a spin-on coating process, a dip coating method, an air-knife coating method, a curtain coating method, a wire-bar coating method, a gravure coating method, a lamination method, an extrusion coating method, combinations of these, or the like. The thickness of the photoresist layer depends on desired pattern and its subsequent application.

Figure 2:
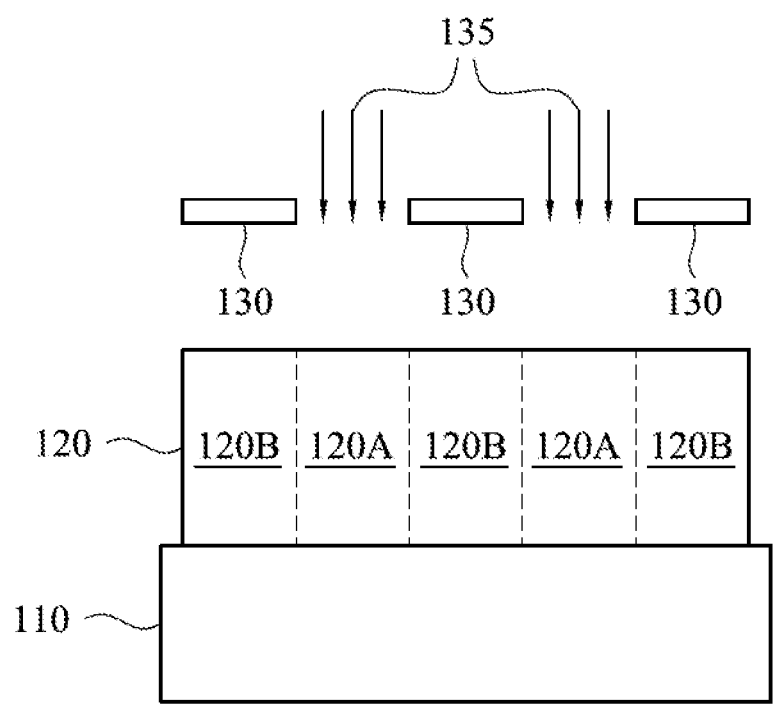
FIG. 2 illustrates a diagram of intermediate stages in a method of manufacturing a semiconductor device according to some embodiments of the invention.

Referring to FIG. 2, a mask or a photomask 130 is placed above the photoresist layer 120, and an exposure radiation source supplies radiation 135 to the photoresist layer 120 through the mask 130. In some embodiments, operation of the exposure to radiation is performed in a photolithography tool, which includes the mask 130 and the exposure radiation source. In some embodiments, the radiation 135 may be ultraviolet light (UV), extreme ultraviolet light (EUV), deep extreme ultraviolet (DUV), electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

A first region 120A of the photoresist layer is exposed to the radiation 135, while a second portion (remaining portion) 120B of the photoresist layer is not exposed (or exposed less) to the radiation 135. In some embodiments when the photoresist layer 120 is the positive photoresist, radiation 135 makes chemical structure of the first region 120A change and become soluble in the aqueous-based developer, such as TMAH solution. In such embodiments, the second region 120B should be insoluble in the developer solution. As described above, the first region 120A may generate photoacid after absorbing the radiation 135. However, the photoacid diffusion may cause an upper portion of the second region 120B including some photoacid, thereby resulting in image blurring after the photolithography process.

A post exposure baking (PEB) operation is selectively performed to the photoresist layer 120 after exposing to the radiation 135 to complete the photoreaction initiated during exposure. The post exposure bake may contribute to the profile of the pattern. In some embodiments, the post exposure bake is performed by heating the photoresist layer 120 at a temperature ranging from about 70° C. to about 110° C. for about 50 seconds to about 90 seconds. The temperature and duration of the post exposure bake depends on the desired pattern and subsequent application.

Figure 3:
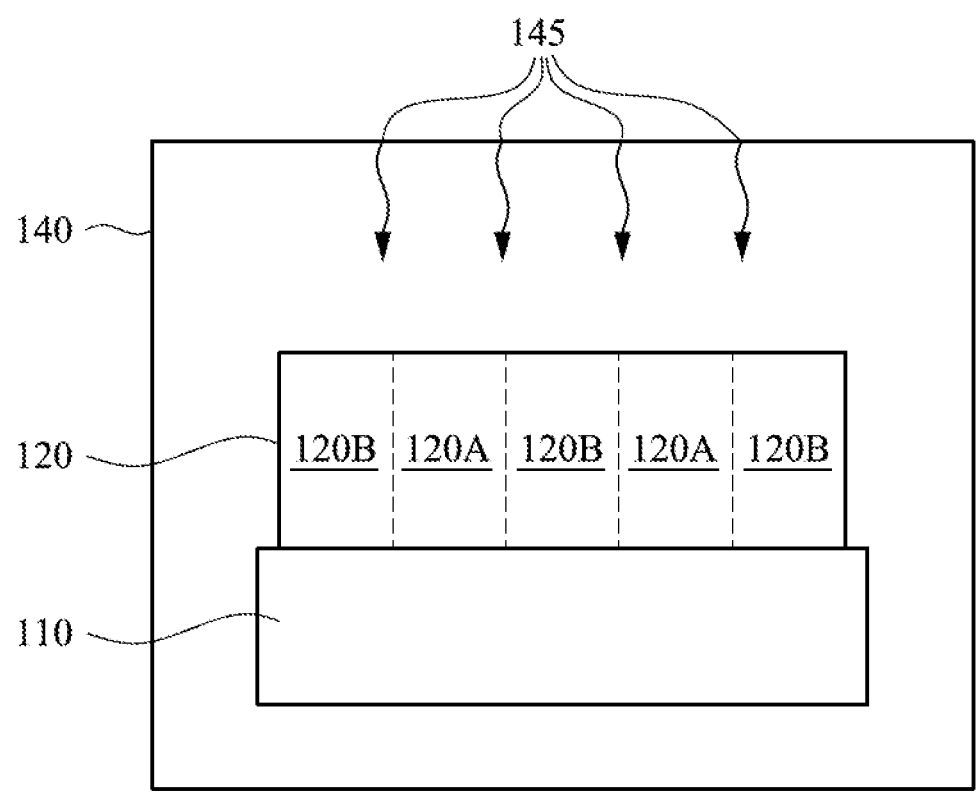
FIG. 3 illustrates a diagram of intermediate stages in a method of manufacturing a semiconductor device according to some embodiments of the invention.

Then, referring to FIG. 3, using a basic gas 145 to treat the photoresist layer 120. It is understood that the "basic gas" used herein also refers to an alkaline gas. The basic gas 145 may react with the photoacid in the photoresist layer 120, such as the photoacid diffusing from the first region 120A to the second region 120B, especially in the upper portion of the photoresist layer 120. In other words, a top surface of the photoresist layer 120 is modified by applying the basic gas 145. In some embodiments, such treating operation is performed in a chamber 140. In such embodiments, another gas in the chamber 140 should be removed first before accessing the basic gas 145 into the chamber 140. In addition to accessing the basic gas 145, a carrier gas, may also be accessed into the chamber 140 together with the basic gas 145. In some embodiments, the carrier gas may be an inert gas (such as argon and helium), nitrogen ($N_2$), or combination thereof. In some embodiments, a pressure of the chamber is in a range from about 1 torr to about 100 torr while treating the photoresist layer 120 with the basic gas 145 into the chamber.

In some embodiments, the basic gas 145 may be a weak base when dissolved in water, such as having a pH value in a range from about 8 to about 9. If the pH value of the basic gas 145 is less than 8, performance of decreasing T-topping profile may not be achieved. If the pH value of the basic gas 145 is greater than 9, the photoresist layer 120 may be damaged. In some embodiments, the basic gas 145 may include ammonia (NH$_3$), amine gas, or combinations thereof. In some embodiments, duration time of accessing the gas 145 into the chamber is less than about 1 min, such as about 30 sec to about 60 sec. The duration of accessing the basic gas 145 may affect the amount of photoacid, if the duration is greater than 1 min, the produced pattern of the photoresist layer 120 may become wider in the bottom surface than the upper surface. In some embodiments, the basic gas 145 is free of a liquid because the liquid may cause damage to the photoresist layer 120.

Afterwards, the photoresist layer 120 is developed by applying a developer. In some embodiments, such development operation may be a negative tone development or a positive tone development. Generally, the negative tone development may dissolve the photoresist layer without the photoacid, while the positive tone development may dissolve the photoresist layer with the photoacid.

Figure 4A:
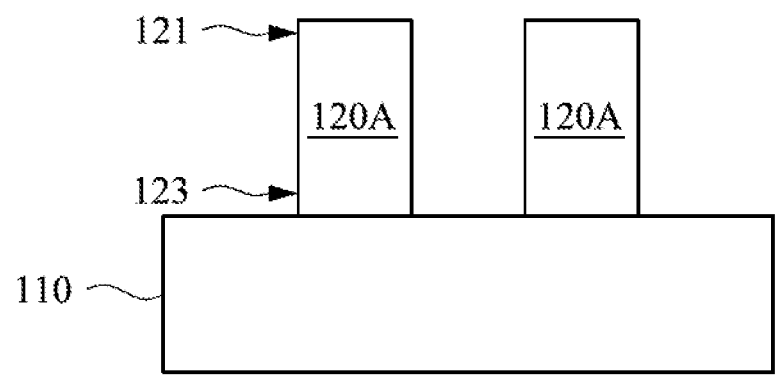
FIGS. 4A-4B illustrate diagrams of intermediate stages in a method of manufacturing a semiconductor device according to some embodiments of the invention.

The first region 120A (i.e. the exposed region) remains on the substrate 110 after developing while performing the negative tone development, thus the second region 120B is removed by the developer, as shown in FIG. 4A. In the embodiments shown in FIG. 4A, the developer may include an organic solvent. The organic solvent can be any suitable solvent. For example, the developer is selected from a group consisting of ethers, glycol ethers, aromatic hydrocarbons, ketone, esters and a combination of two or more of the foregoing solvents. In some embodiments, the developer includes propylene glycol methyl ether acetate (PGMEA), propylene glycol monomethyl ether (PGME), toluene, methyl isobutyl ketone, cycloheptanone, tetrahydrofuran (THF), n-butyl acetate (nBA), 2-heptanone (MAK), and the like.

After the negative tone development, the patterned photoresist layer, such as the first region 120A shown in FIG. 4A, is smaller in width and has almost perfectly straight sidewalls. In some embodiments, a width of an upper surface 121 of the first region 120A is substantially the same as a width of a bottom surface 123 of the first region 120A. In some embodiments, the sidewalls of the first region 120A are substantially perpendicular to the bottom surfaces 123, and/or the sidewalls of the first region 120A are substantially perpendicular to the upper surfaces 121.

Figure 4B:
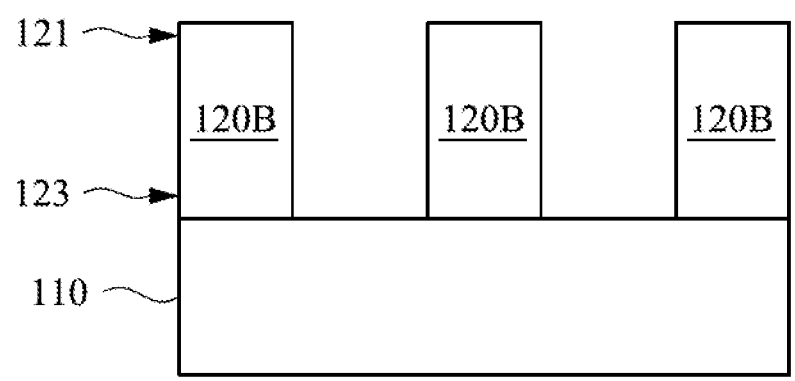

In another embodiment, the development may be a positive tone development, which may use an aqueous solution as the developer, such as an aqueous solution of tetramethylammonium hydroxide. As shown in FIG. 4B, in the positive tone development, the second region 120B remains on the substrate 110 while the first region 120A is removed by the developer. Similarly, after the positive tone development, the patterned photoresist layer, such as the second region 120B shown in FIG. 4B, is smaller in width and has almost perfectly straight sidewalls. In some embodiments, a width of an upper surface 121 of the second region 120B is substantially the same as a width of a bottom surface 123 of the second region 120B. In some embodiments, the sidewalls of the second region 120B are substantially perpendicular to the bottom surfaces 123, and/or the sidewalls of the second region 120B are substantially perpendicular to the upper surfaces 121.

Generally, resolution of the pattern is worse in the negative tone development. If the photoacid generates excessively in the upper surface of the photoresist layer, T-topping pattern profile occurs. However, some embodiments of the present invention achieve improved resolution by treating the photoresist layer with the basic gas after exposure thereby decreasing the concentration of the photoacid in the upper surface. Therefore, after the development, the patterned photoresist layer shows improved critical dimension and critical dimension uniformity. Moreover, the patterned photoresist layer decreases T-topping pattern profile. Additionally, the method of the present disclosure is suitable for any type of pattern.

It is understood that the aforementioned steps described in the embodiments of the disclosure can be combined or skipped, and the order thereof can be adjusted according actual requirements.

Although the disclosure has been described in considerable detail with reference to certain embodiments thereof, other embodiments are possible. Therefore, the spirit and scope of the appended claims should not be limited to the description of the embodiments contained herein.

What is claimed is:

1. A method of manufacturing a semiconductor device, comprising:
    forming a photoresist layer over a substrate;
    exposing, using a mask, a portion of the photoresist layer to a radiation;
    treating, using a basic gas, the photoresist layer in a chamber, wherein the basic gas has a pH value in a range from about 8 to about 9 when dissolved in water, and a pressure of the chamber is in a range from about 1 torr to about 100 torr; and
    developing the photoresist layer to form a patterned photoresist layer over the substrate.

2. The method of claim 1, further comprising performing a post exposure bake before treating the photoresist layer.

3. The method of claim 1, wherein treating the photoresist layer comprises applying the basic gas and a carrier gas over the photoresist layer.

4. The method of claim 3, wherein the carrier gas comprises an inert gas, nitrogen, or combinations thereof.

5. The method of claim 1, wherein the photoresist layer comprises a positive photoresist, and developing the photoresist layer comprises negative tone development.

6. The method of claim 1, wherein the photoresist layer comprises a positive photoresist, and developing the photoresist layer comprises positive tone development.

7. A method of manufacturing a semiconductor device, comprising:
    coating a photoresist layer over a substrate;
    exposing, using a mask, the photoresist layer to a radiation;
    performing a post exposure baking to the photoresist layer over the substrate;
    removing a first gas from a chamber;
    after removing the first gas from the chamber, modifying a top surface of the photoresist layer in the chamber by using a second gas, wherein a pressure of the chamber is in a range from about 1 torr to about 100 torr; and
    applying a developer to the photoresist layer.

8. The method of claim 7, wherein the second gas is basic when dissolved in water.

9. The method of claim 7, wherein the second gas comprises ammonia, amine gas, or combinations thereof.

10. The method of claim 7, wherein the post exposure baking is performed at a temperature in a range of about 70° C. to about 110° C.

11. The method of claim 7, wherein duration of modifying the top surface of the photoresist layer is less than about 1 minute.

12. The method of claim 7, wherein the developer comprises an aqueous solution.

13. The method of claim 7, wherein the developer comprises an organic solvent.

14. A method of manufacturing a semiconductor device, comprising:
- forming a photoresist layer over a substrate, wherein the photoresist layer comprises a photoacid generator;
- exposing a first region of the photoresist layer to a radiation to produce photoacid in the photoresist layer;
- performing a post exposure baking to the photoresist layer over the substrate;
- causing a basic gas flowing over the photoresist layer, in a chamber, to react with the photoacid in the photoresist layer, wherein a pressure of the chamber is in a range from about 1 torr to about 100 torr; and
- applying a developer to the photoresist layer to remove a second region of the photoresist layer, wherein the second region is not exposed to the radiation.

15. The method of claim 14, wherein the developer is selected from a group consisting of ethers, glycol ethers, aromatic hydrocarbons, ketone, esters, or combinations thereof.

16. The method of claim 14, wherein after applying the developer to the photoresist layer, sidewalls of the first region of the photoresist layer are substantially perpendicular to a bottom surface of the photoresist layer.

17. The method of claim 14, wherein duration of causing a basic gas flowing over the photoresist layer is in a range of 30 sec to 60 sec.

18. The method of claim 14, wherein causing a basic gas flowing over the photoresist layer comprises causing an inert gas or nitrogen flowing with the basic gas.

* * * * *